(12) United States Patent
Mattei et al.

(10) Patent No.: US 6,740,930 B2
(45) Date of Patent: May 25, 2004

(54) LATERAL MOS POWER TRANSISTOR

(75) Inventors: Sandra Mattei, Marseilles (FR);
Rosalia Germana, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/172,759

(22) Filed: Jun. 14, 2002

(65) Prior Publication Data

US 2003/0006467 A1 Jan. 9, 2003

(30) Foreign Application Priority Data

Jun. 15, 2001 (FR) .............................. 01 07870

(51) Int. Cl.[7] .............................................. H01L 29/76
(52) U.S. Cl. .................. 257/329; 257/139; 257/141; 257/341; 257/342; 257/343; 257/401
(58) Field of Search ................ 257/139, 141, 257/329, 341, 343, 401, 342

(56) References Cited

U.S. PATENT DOCUMENTS

| 4,794,432 A | | 12/1988 | Yilmaz et al. | |
|---|---|---|---|---|
| 5,514,608 A | | 5/1996 | Williams et al. | |
| 5,635,742 A | * | 6/1997 | Hoshi et al. | ................ 257/337 |
| 5,760,440 A | | 6/1998 | Kitamura et al. | |
| 6,011,278 A | | 1/2000 | Alok et al. | |
| 6,459,142 B1 | * | 10/2002 | Tihanyi | ....................... 257/621 |
| 2002/0030226 A1 | * | 3/2002 | Yasuhara et al. | ............ 257/342 |
| 2002/0167047 A1 | * | 11/2002 | Yasuhara et al. | ............ 257/341 |

FOREIGN PATENT DOCUMENTS

DE        198 01 095 A1      7/1999

OTHER PUBLICATIONS

European Search Report from corresponding European application No. 02354096.

* cited by examiner

Primary Examiner—Long Pham
Assistant Examiner—Wai-Sing Louie
(74) Attorney, Agent, or Firm—Lisa K. Jorgenson; James H. Morris; Wolf, Greenfield & Sacks, P.C.

(57) ABSTRACT

A MOS power transistor formed in an epitaxial layer of a first conductivity type, the MOS power transistor being formed on the front surface of a heavily-doped substrate of the first conductivity type, including a plurality of alternate drain and source fingers of the second conductivity type separated by a channel, conductive fingers covering each of the source fingers and of the drain fingers, a second metal level connecting all the drain metal fingers and substantially covering the entire source-drain structure. Each source finger includes a heavily-doped area of the first conductivity type in contact with the epitaxial layer and with the corresponding source finger, and the rear surface of the substrate is coated with a source metallization.

11 Claims, 2 Drawing Sheets

LATERAL MOS POWER TRANSISTOR

BACKGROUND OF THE INVENTION

1. Field of the Invention

The present invention relates to medium-power MOS transistors.

2. Discussion of the Related Art

In the field of medium power MOS transistors, structures of vertical type in which the source is on the front surface side and the drain is on the rear surface side, and structures of lateral type in which the source and the drain are on the front surface side, are known. Generally, when the current to be switched is relatively high, transistors of vertical type are preferred, to minimize access resistances.

Indeed, as will be shown hereafter, lateral-type structures pose a problem linked to the resistances of the metallizations of access to the source and/or to the drain.

However, lateral structures are often easier to form and technologically simpler.

FIGS. 1A and 1B respectively illustrate a simplified cross-section view and a top view of a conventional P-channel MOS transistor of lateral type. FIG. 1A is a cross-section view along line A—A of FIG. 1B. It should be noted that none of the drawings is to scale with respect to a real device and that these drawings are not scaled with respect to each other, as is conventional in the representation of semiconductor components.

The P-channel MOS transistor of FIGS. 1A and 1B is formed in an N-type semiconductor substrate 1, generally an epitaxial layer formed above a single-crystal N+-type silicon wafer. Above this substrate are formed gate fingers 3 separated from the substrate by a thin insulating layer 4. Conventionally, the gate fingers are made of polysilicon and the gate insulator is silicon oxide. The gate fingers are interconnected and connected to a gate terminal in a way not shown. The gate fingers are covered and laterally surrounded with an insulating layer 5, also generally made of silicon oxide. These gate fingers are used as a mask for forming in the substrate 1 a heavily-doped P-type regions. These P regions alternately correspond to source fingers S and to drain fingers D. Each of the source fingers and of the drain fingers is covered with a metal finger, respectively 7 and 8. The metal fingers are etched in a first metallization level. The structure is covered with an insulating layer 9 in which openings are formed to enable establishing contacts between a source metallization 11 and the source metal fingers 7 and between a drain metallization 12 and the drain metal fingers 8. The source and drain metallizations are etched in a second metallization level. Only drain metallization 12 is visible in the cross-section view of FIG. 1A.

In the top view of FIG. 1B, source metallization 11 has been shown in contact with extensions of source fingers 7. The drain metallization substantially covers all the drain and source fingers and is in contact with the drain fingers. The contact areas between the first and second metallization levels are indicated in FIG. 1B by squares marked with a cross. Whatever the topology chosen for the second metallization level, it should be noted that, at least for the drain fingers or the source fingers, there exists a certain length of the first metallization level between the contact with the second metallization and the end of each finger, which corresponds to an access resistor.

One of the aspects of the present invention is to take into account the existence of this access resistor and its value.

Assuming that the drain and source metal fingers have a 1-$\mu$m width and are distant from one another by 1 $\mu$m, that is, for a square having a one-millimeter side, there will be approximately 250 source fingers and 250 drain fingers, and assuming that the first metal level has a sheet resistance of 60 m$\Omega$ per square, this means that a 1-mm long and 1-$\mu$m wide stripe has a 60-$\Omega$ resistance. For a square having a 1-mm side comprised of 250 fingers, the resistance will be 60/250 $\Omega$ or 240 m$\Omega$ or, in other words, 240 m$\Omega$.mm$^2$. In a current technology, this resistance is higher than the on-state resistance of the actual channel area, which is on the order of 50 m$\Omega$.mm$^2$.

In the example of structure of FIG. 1B, this metal resistance is essentially due to the source fingers. The contact between the metallization level and the drain fingers is, however, very satisfactory.

Thus, an object of the present invention is to provide a medium power MOS transistor structure of lateral type in which the resistances of access to the drain and to the source are reduced.

A more specific object of the present invention is to provide such a transistor of P-channel type.

SUMMARY OF THE INVENTION

The present invention aims at reducing the access resistance to a multiple-finger lateral MOS transistor.

To achieve this and what other the present invention provides a MOS power transistor formed in an epitaxial layer of a first conductivity type formed on the front surface of a heavily-doped substrate of the first conductivity type, including a plurality of alternate drain and source fingers of the second conductivity type separated by a channel, conductive fingers covering each of the source fingers and the drain fingers, a second metal level connecting all the drain metal fingers and substantially covering the entire source-drain structure. Each source finger includes a heavily-doped area of the first conductivity type in contact with the epitaxial layer and with the corresponding source finger, and the rear surface of the substrate is coated with a source metallization.

According to an embodiment of the present invention, the heavily-doped area of the first conductivity type of each source finger extends substantially over the source finger length.

According to an embodiment of the present invention, the heavily-doped area of the first conductivity type of each source finger extends over selected areas of the source finger length.

An advantage of the present invention is that, in the more specific case of a P-channel MOS transistor, the described structure is very compatible with existing manufacturing technologies and currently-used substrates (N-type epitaxial layer on an N+ substrate).

The foregoing objects, features and advantages of the present invention, will be discussed in detail in the following non-limiting description of specific embodiments in connection with the accompanying drawings.

DETAILED DESCRIPTION

Figure 1A:
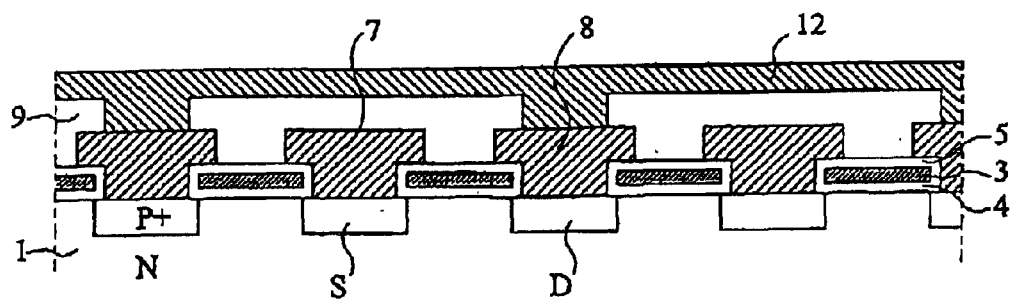
FIGS. 1A and 1B respectively are a cross-section view and a top view of a conventional lateral MOS transistor.
Figure 1B:
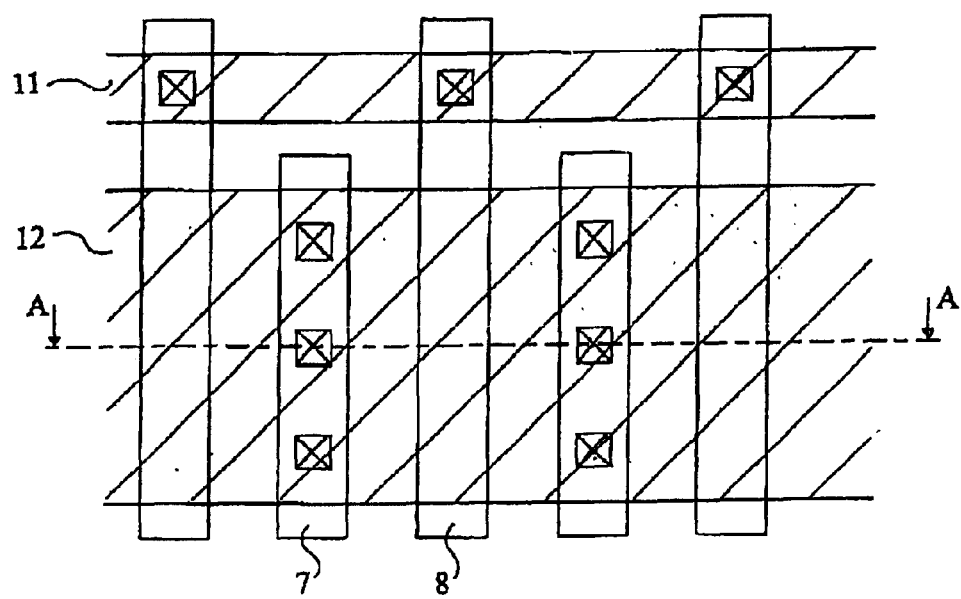
Figure 2A:
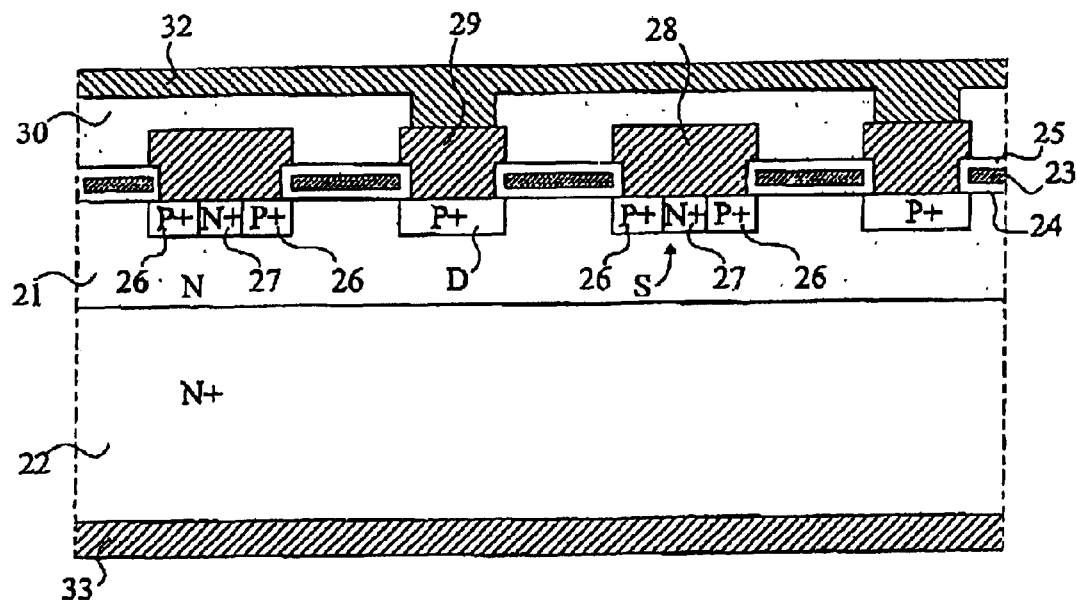
FIGS. 2A and 2B respectively are a cross-section view and a top view of a MOS transistor according to the present invention.
Figure 2B:
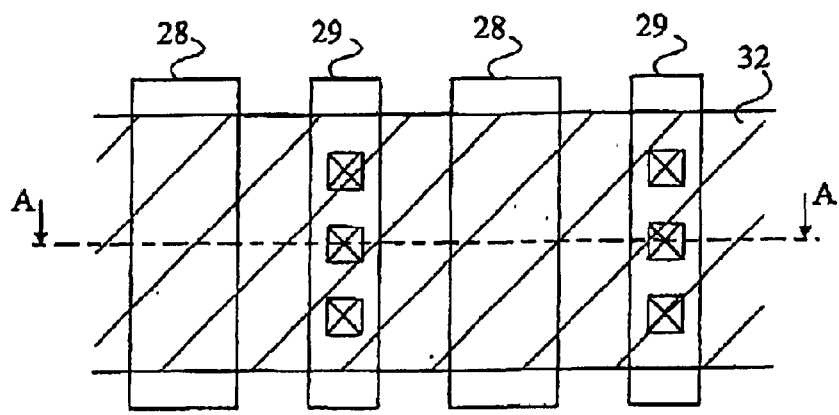

FIGS. 1A and 2A respectively are cross-section views along lines A—A of FIGS. 1B and 2B.

As usual in semiconductor representation, none of the drawings is drawn to scale with respect to a real component. Further, the drawings are not scaled with respect to one another.

In FIGS. 2A and 2B, a lateral P-channel MOS transistor is formed in an N-type epitaxial layer 21 formed on an N+-type substrate 22. The transistor includes interconnected gate fingers 23 formed above a thin insulator 24 and surrounded with an insulating layer 25. In the epitaxial layer, between the gate fingers, are present heavily-doped P-type regions alternately corresponding to drain fingers D and to source fingers S. Each source finger S includes, on the one hand, a heavily-doped P+-type region 26 forming the actual source finger and, on the other hand, one or several N+-type regions 27 in contact with the substrate. Regions 27 may be located substantially at the center of source fingers 26 and may be continuous over the entire length of each of the source fingers or be localized in the fingers.

Source metal fingers 28 formed above the source fingers are in contact with the actual P+-type source regions 26 and with the doped regions 27 of the opposite conductivity type. Drain metal fingers 29 are formed above the drain fingers. Metal fingers 28 and 29 are etched from a first metallization level. Source metal fingers 28 are devoid of any external connection and are only used to establish a short-circuit between regions 26 and 27. An insulating layer 30 is deposited above the structure and an upper metallization 32 is in contact with all drain metal fingers 29.

The rear surface of the substrate is covered with a metallization 33 and forms a source metallization and is connected to the voltage to which the source is to be connected, that is, a positive voltage in the case of a P-channel MOS transistor.

Thus, when gate 23 of the MOS transistor is properly biased, that is, biased to the ground voltage in the case of a P-channel transistor, a current flows from source metallization 33, via substrate 22 and epitaxial layer 21, to N+ regions 27. Via metal fingers 28, the current flows through regions 26, then through the channel regions of the transistors, to drain regions D, drain metal fingers 29, and drain metallization 32.

In this structure, the resistance of access to the drain is as small as in the case of the structure of FIGS. 1A and 1B. However, the resistance of access to the source is much smaller than in the case of the structure of FIGS. 1A and 1B. Indeed, as an example, for an epitaxial layer having a thickness on the order of 3 $\mu$m and a doping level of $4\times10^{16}$ atoms/cm$^3$, a resistance is obtained in epitaxial layer 21 between wafer 22 and each region 27, which is on the order of 15 m$\Omega$.mm$^2$ only, that is, approximately 16 times smaller than in the case of the conventional structure of FIGS. 1A and 1B. The operation of the MOS transistor remains, as concerns its channel, an operation of lateral transistor type between source fingers and drain fingers, although the conduction of the source metallization to the source fingers is vertical. The transistor according to the present invention can thus be called a semilateral transistor.

The present invention is likely to have various alterations, modifications, and improvements which will readily occur to those skilled in the art, especially as concerns the forming of each of the drain and source fingers, which may use any known technology. Structures with spacers may, for example, be performed to obtain LDD-type drains.

All conductivity types may be inverted to form N-channel transistors.

The N+ regions 27 formed in each source finger 26 may be deeper than the P+ regions 26 of these fingers. Thus, the P+ regions 26 will preferably be formed after N+ regions 27 to reduce the anneals to which they are submitted.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

What is claims is:

1. A MOS power transistor formed in an epitaxial layer of a first conductivity type, the epitaxial layer being formed on a front surface of a heavily-doped substrate of the first conductivity type, including a plurality of alternate drain and source lingers of a second conductivity type separated by channel regions formed in said epitaxial layer, conductive fingers covering each of the source fingers and the drain fingers, a second metal level connecting all the drain metal fingers and substantially covering the entire source-drain structure, wherein each source finger has a corresponding heavily-doped area of the first conductivity type in contact with the epitaxial layer and with the corresponding source finger, and wherein a rear surface of the substrate is coated with a source metallization.

2. The MOS transistor of claim 1, wherein each source finger has a length, and wherein for each one of the source fingers, the corresponding heavily-doped area of the first conductivity type extends substantially over the entire length of the source finger.

3. The MOS transistor or claim 1, wherein for each of the source fingers, the corresponding heavily-doped area of the first conductivity type extends over only intermittent portions of the source finger.

4. A MOS power transistor, comprising:

a substrate of a first conductivity type, the substrate having a first surface coated with a source metallization;

an epitaxial layer of the first conductivity type, the epitaxial layer being formed on a second surface of the substrate;

a plurality of drain and source fingers of a second conductivity type separated by channel regions in the epitaxial layer;

an area of the first conductivity type in contact with the epitaxial layer and at least one of the source fingers;

a plurality of source metal fingers formed upon the plurality of source fingers;

a plurality of drain metal fingers formed upon the plurality of drain fingers; and a metal level connecting the plurality of drain metal fingers.

5. The MOS power transistor of claim 4, wherein the substrate is heavily doped.

6. The MOS power transistor of claim 4, wherein the plurality of source and drain fingers are arranged in an alternating pattern of source and drain fingers.

7. The MOS power transistor of claim 4, wherein the area of the first conductivity type in contact with the at least one of the source fingers is heavily doped.

8. A MOS power transistor, comprising:

a substrate of a second conductivity type, the substrate having first and second surfaces;

a first metallization layer that coats the first surface of the substrate;

an epitaxial layer of the second conductivity type formed on the second surface of the substrate;

a plurality of finger sets formed within the epitaxial layer, each finger set including at least a first finger and a second finger separated by a channel region in the epitaxial layer, one of the first and second fingers being a source finger and the other being a drain finger, the first and second fingers each being of a first conductivity type, each finger set further including an area of the second conductivity type in contact with the epitaxial layer and the first finger;

a plurality of conductive fingers, one of the conductive fingers being formed upon each of the first and second fingers; and a second metallization layer connecting the plurality of conductive fingers formed on the second fingers.

9. The MOS power transistor of claim 8, wherein the substrate is heavily doped.

10. The MOS power transistor of claim 8, wherein the plurality of finger sets are arranged to form a pattern of alternating first and second fingers separated by channel regions in the epitaxial layer.

11. The MOS power transistor of claim 8, wherein the plurality of areas of the second conductivity type are heavily doped.

* * * * *